(12) United States Patent
Meehan et al.

(10) Patent No.: US 7,938,014 B2
(45) Date of Patent: May 10, 2011

(54) SEALED CAPACITIVE SENSOR

(75) Inventors: Peter G. Meehan, Raheen (IE); William Hunt, Castletroy (IE); Eamon Hynes, Raheen (IE); John O'Dowd, Crecora (IE); Oliver Kierse, Ballina (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/070,849

(22) Filed: Feb. 21, 2008

(65) Prior Publication Data

US 2008/0210013 A1    Sep. 4, 2008

Related U.S. Application Data

(63) Continuation of application No. 11/353,359, filed on Feb. 14, 2006, now abandoned.

(60) Provisional application No. 60/656,238, filed on Feb. 25, 2005.

(51) Int. Cl.
    G01L 1/14    (2006.01)
(52) U.S. Cl. .............. 73/780; 73/718; 73/724
(58) Field of Classification Search .......... 73/718, 73/724, 780; 257/737
    See application file for complete search history.

(56) References Cited

U.S. PATENT DOCUMENTS

| | | | |
|---|---|---|---|
| 3,748,571 A * | 7/1973 | Kurtz | 361/283.4 |
| 4,388,668 A * | 6/1983 | Bell et al. | 361/283.4 |
| 4,426,673 A * | 1/1984 | Bell et al. | 361/283.4 |
| 4,562,742 A * | 1/1986 | Bell | 73/718 |
| 5,241,864 A * | 9/1993 | Addie et al. | 73/718 |
| 5,436,795 A * | 7/1995 | Bishop et al. | 361/283.4 |
| 5,488,954 A * | 2/1996 | Sleva et al. | 600/459 |
| 5,891,751 A * | 4/1999 | Kurtz et al. | 438/53 |
| 5,933,317 A | 8/1999 | Moncrieff | |
| 6,122,973 A * | 9/2000 | Nomura et al. | 73/724 |
| 6,267,009 B1 * | 7/2001 | Drewes et al. | 73/718 |
| 6,441,449 B1 | 8/2002 | Xu et al. | |
| 6,470,754 B1 * | 10/2002 | Gianchandani | 73/718 |
| 6,576,998 B1 * | 6/2003 | Hoffman | 257/724 |
| 6,640,642 B1 * | 11/2003 | Onose et al. | 73/718 |
| 6,644,117 B1 * | 11/2003 | Kueck et al. | 73/488 |
| 6,775,124 B2 | 8/2004 | Cheung | |
| 6,912,910 B2 * | 7/2005 | Miyashita | 73/718 |
| 7,043,995 B2 * | 5/2006 | Mattmann | 73/715 |
| 7,082,835 B2 * | 8/2006 | Cook et al. | 73/715 |
| 7,135,749 B2 * | 11/2006 | Sakai et al. | 257/419 |
| 7,150,195 B2 * | 12/2006 | Jacobsen et al. | 73/715 |
| 7,188,530 B2 * | 3/2007 | Pedersen et al. | 73/715 |
| 7,353,711 B2 * | 4/2008 | O'Dowd et al. | 73/718 |
| 7,401,523 B2 * | 7/2008 | Meehan et al. | 73/718 |
| 7,647,836 B2 * | 1/2010 | O'Brien et al. | 73/756 |
| 2002/0025595 A1 | 2/2002 | Xu et al. | |
| 2003/0095371 A1 | 5/2003 | Cheung | 361/326 |
| 2003/0133588 A1 | 7/2003 | Pedersen | 381/423 |
| 2004/0125578 A1 * | 7/2004 | Konishi et al. | 361/783 |
| 2004/0129947 A1 * | 7/2004 | Miyashita | 257/99 |
| 2005/0103112 A1 * | 5/2005 | Pedersen et al. | 73/718 |
| 2005/0229710 A1 | 10/2005 | O'Dowd et al. | |
| 2006/0191351 A1 | 2/2006 | Meehan et al. | |
| 2006/0093171 A1 | 5/2006 | Zhe et al. | 381/191 |
| 2006/0163726 A1 * | 7/2006 | Kierse et al. | 257/737 |

\* cited by examiner

*Primary Examiner* — Freddie Kirkland, III
(74) *Attorney, Agent, or Firm* — Sunstein Kann Murphy & Timbers LLP

(57) ABSTRACT

A sealed capacitive sensor includes a substrate having a diaphragm forming a first plate of a capacitor; a second fixed plate of the capacitor spaced from the diaphragm and defining a predetermined dielectric gap and a sealing medium connecting together the substrate and fixed plate in an integrated structure and hermetically sealing the gap.

20 Claims, 6 Drawing Sheets

SEALED CAPACITIVE SENSOR

RELATED APPLICATIONS

This application is a continuation of patent application Ser. No. 11/353,359, filed Feb. 14, 2006, now abandoned and claims the benefit of U.S. Provisional Application No. 60/656,238, filed Feb. 25, 2005, incorporated by reference herein.

FIELD OF THE INVENTION

This invention relates to a sealed capacitive sensor.

BACKGROUND OF THE INVENTION

In conventional capacitive sensors the fixed plate, typically silicon, is connected to the diaphragm, typically formed in a ceramic substrate, using solder balls. One problem with this is that the solder balls are typically about 150-200 µm in height. This defines at least in part the dimension of the capacitive gap. With such a large height the gap, too, is large and this reduces the sensitivity. Therefore the diaphragm has to deflect more under pressure to obtain the desired sensitivity. To accommodate this the diaphragm must be made thinner to get the desired sensitivity. This makes the diaphragm more susceptible to cracking and fracturing. One solution is to provide holes to receive the solder balls and thus reduce their effective height. But the addition of these holes adds considerable cost and must be done extremely accurately. Even assuming a proper balance between solder ball height and diaphragm thickness can be obtained, the solder balls themselves contribute to inaccuracy as they may fracture, break and are subject to creep from temperature and time.

Another shortcoming is that solder balls do not hermetically seal the gap: contaminants and conditions such as changes in ambient pressure can effect the gap and change the capacitance, independent of any change in the parameter being measured by displacement of the diaphragm. To accommodate this the entire device can be placed in a sealed package but this, too, adds to the cost.

BRIEF SUMMARY OF THE INVENTION

It is therefore an object of this invention to provide an improved sealed capacitive sensor.

It is a further object of this invention to provide such an improved sealed capacitive sensor which provides a hermetically sealed dielectric gap.

It is a further object of this invention to provide such an improved sealed capacitive sensor which is more robust, reliable and accurate, yet lower in cost.

It is a further object of this invention to provide such an improved sealed capacitive sensor in which the dielectric gap is not vulnerable to fracture, breakage or creep of solder balls.

It is a further object of this invention to provide such an improved sealed capacitive sensor which is less susceptible to contamination.

The invention results from the realization that a simpler, less costly, more accurate, reliable and robust capacitive sensor can be achieved by using a sealing medium such as a frit or glass frit to both connect together and hermetically seal a substrate having a diaphragm forming a first plate of a capacitor and a second fixed plate of a capacitor spaced from the diaphragm and defining a predetermined dielectric gap.

The subject invention, however, in other embodiments, need not achieve all these objectives and the claims hereof should not be limited to structures or methods capable of achieving these objectives.

This invention features a sealed capacitive sensor including a substrate having a diaphragm forming a first plate of a capacitor and a second fixed plate of the capacitor spaced from the diaphragm and defining a predetermined dielectric gap. There is a sealing medium which connects together the substrate and the fixed plate in an integral structure and hermetically seals the gap.

In a preferred embodiment, the substrate may include a ceramic, or it may include silicon. The fixed plate may include silicon. The sealing medium may be a frit; it may be a glass frit. At least one of the first and fixed plates may include a metal layer. At least one of the first and fixed plates may include silicon. Each of the silicon plates may be doped. The fixed plates may bear an active electronic circuit associated with the capacitive sensor. The active electronic circuit may be on a separate chip. There may be an insulation layer between the active electronic circuit and the fixed plate. The fixed plate may include a recess which defines at least a part of the gap dimension. The sealing medium may define at least a part of the gap dimension. The fixed plate may be electrically accessed through a wire bonding lead. The first plate may be electrically accessed through a conductor buried in the substrate traversing the sealing medium. The fixed plate may include a second recess for housing an active electric circuit associated with a capacitive sensor. There may be a cover and a second sealing medium for connecting the cover to the fixed plate and hermetically sealing the second recess. The sealing medium may include a frit; it may be a glass frit. There may be an over mold covering the fixed plate and attached to the substrate.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
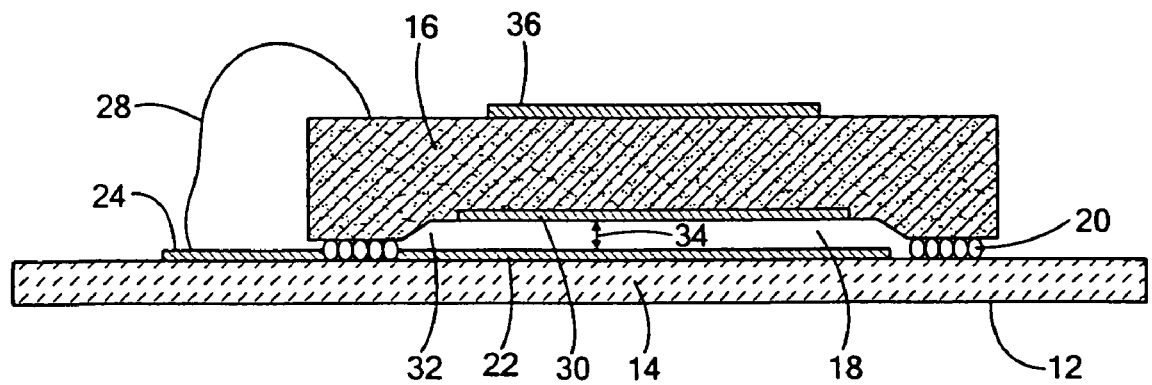
FIG. 1 is a side sectional diagrammatic view of a sealed capacitive sensor according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1, a sealed capacitive sensor 10 including a ceramic substrate 12, for example, $Al_2O_3$ having a flexible diaphragm 14 and a fixed plate silicon die 16 spaced from diaphragm 14 defining a dielectric gap 18. Substrate 12 is connected to fixed plate or die 16 to form an integral structure by means of a sealing medium 20, such as, a frit or glass frit, for example, a glass frit sold by Ferroelectronics Material Systems, Inc. of Vista, Calif., under the name of Seal Glass Paste, DL11036 Model FX-11-036. Other sealing mediums can be used, such as organic or inorganic adhesives, for example, Ablestik 660 available from Ablestick Laboratories, Rancho Domingues, Calif. Sealing medium or frit 20 not only connects together fixed plate 16 and substrate 12, but it also forms a hermetic seal about gap 18 so that no contaminates from the outside can enter and no spurious changes of pressure can enter that would change the normal conditions in the gap. In this way only the parameter, such as, pressure or force which is being sensed by the capacitive sensor 10 will flex diaphragm 14 and change the dimension of gap 18, thereby, changing the capacitance which change is used as an indication of the parameter being measured.

Figure 2:
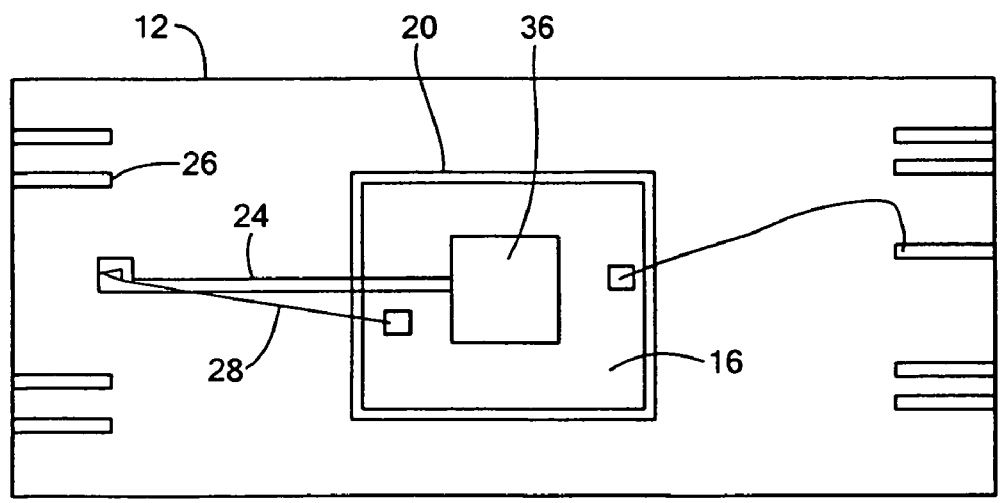
FIG. 2 is a top view of the sealed capacitive sensor of FIG. 1.

In addition to diaphragm 14 the first plate of the capacitor includes a metal layer 22 which may be diffused into the ceramic which extends out through or under the frit 20 to trace 28 for connection to circuitry this may be seen as a top view in FIG. 2. Fixed plate 16, FIG. 1, formed from a silicon die forms the plate of the capacitor doped or undoped and may in addition in some cases have its own metal plate 30. Although not a necessary limitation of the invention a recess 32 is formed in fixed plate 16. In this case dimension 34 of gap 18 is determined by the size of recess 32, the sealing medium or frit 20 and the height, small though it be, of metal layer 22. An active circuit 36, such as, signal processing circuitry, accelerometers and the like associated with the capacitive sensor 10 may be fabricated right in the silicon die of fixed plate 16. Metal layer 22 may be circular or another shape as required. Ceramic substrate 12 with diaphragm 14 may be 100 to 200 microns thick for sensing tire pressures and perhaps approximately 400 microns thick for sensing braking pressure.

Figure 3:
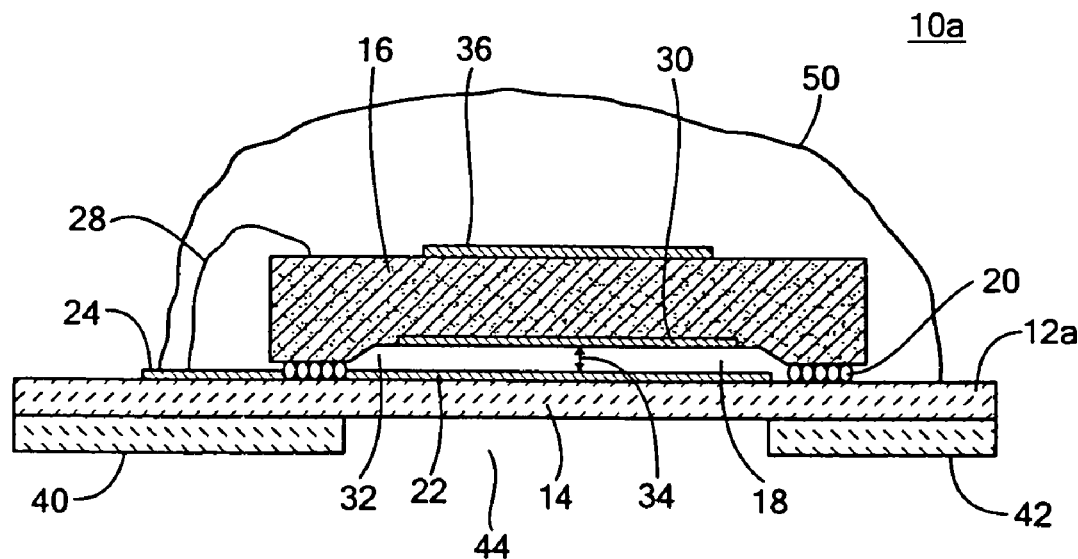
FIG. 3 is a view similar to FIG. 1 with the substrate diaphragm reinforced.

Ceramic substrate 12a, FIG. 3, may be formed with reinforcing supports 40, 42 where necessary. Alternatively, ceramic 12a can be formed as a unit with reinforcing supports 40, 42 and have portion 44 etched or machined away to the same effect. Alternatively, diaphragm 44 and supports 40,42 may be made integral and co-fired with substrate 12. Even though gap 18 is fully hermetically sealed and substrate 12 is well secured to silicon die fixed plate 16 by sealing medium frit 20, a further protection may be added in the nature of a over mold or cover, such as, a glob top or plastic 50, FIG. 3. This may be made of any suitable material such as DYM 9001-E-v3.1 from DYMAX Corporation, 51 Greenwoods Road, Torrington, Conn. 06790 or Sumitomo 6300 H G770 from Sumitomo Corporation.

Figure 4:
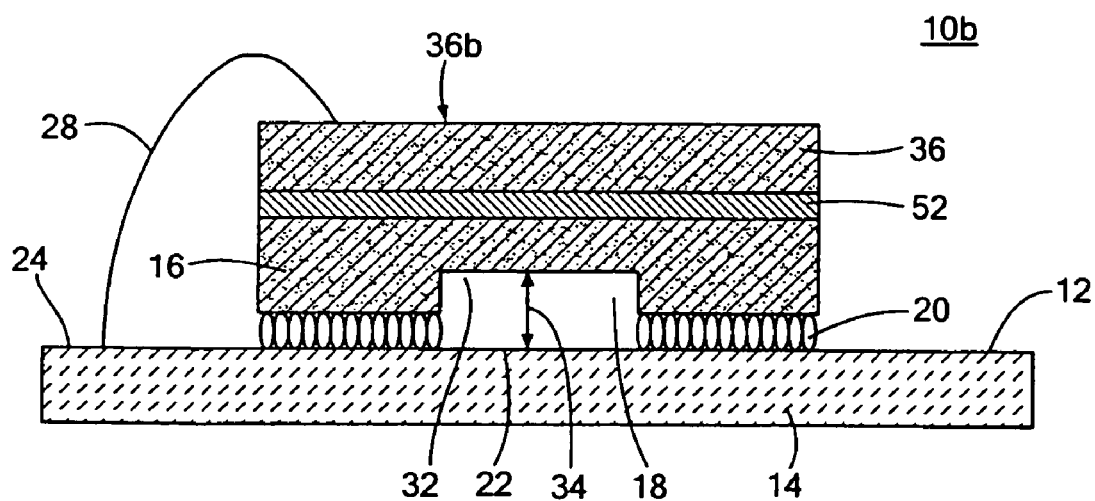
FIG. 4 is a view similar to FIG. 1 with the active circuit as a silicon on insulation layer.
Figure 5:
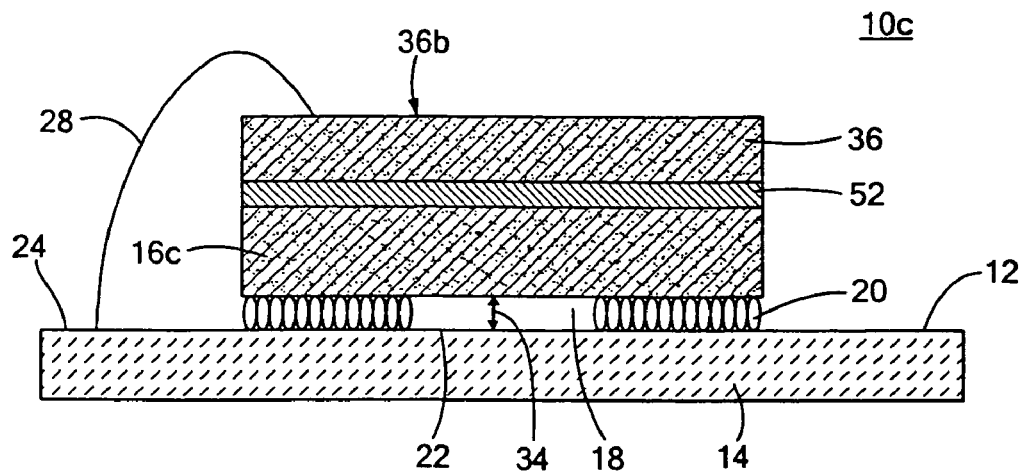
FIG. 5 is a view similar to FIG. 4 without a recess in the fixed plate and the gap dimensions defined solely by the sealing medium.
Figure 6:
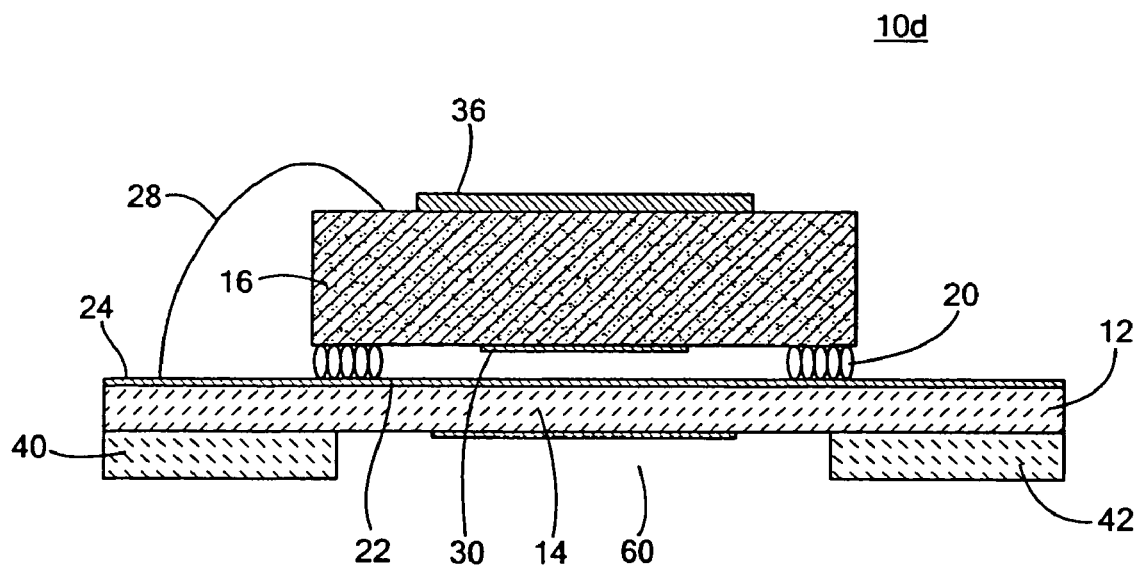
FIG. 6 is a view similar to FIG. 3 with metal plates on the fixed plate and both sides of the diaphragm.
Figure 7:
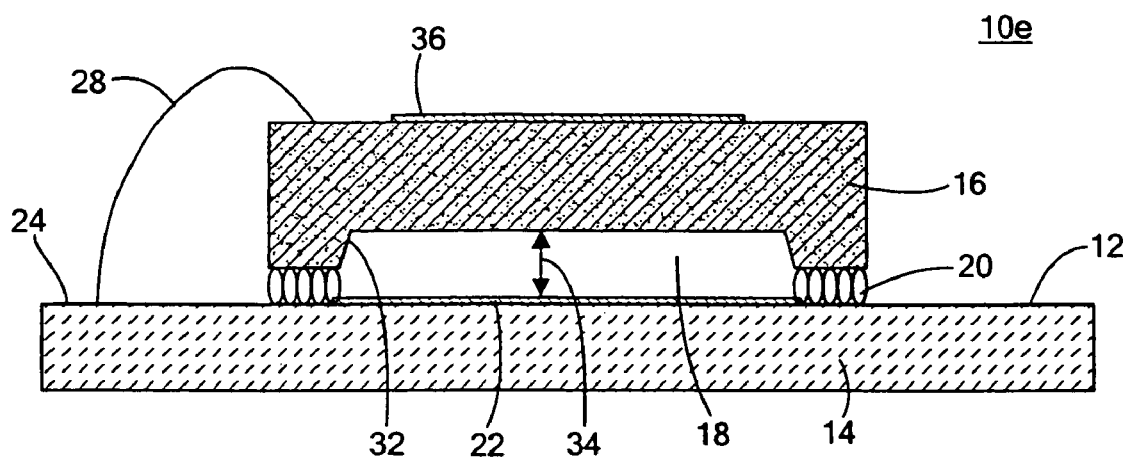
FIG. 7 is a view similar to FIG. 1 made entirely of silicon.

The active circuit need not be fabricated directly on fixed plate silicon die 16, FIG. 4, it may be a silicon on insulation (SOI) circuit 36b mounted on insulation 52 on die 16. Although thus far FIGS. 1 through 4 depict gap 18 as formed at least partially by recess 32, this is not a necessary limitation of the invention, for as shown in FIG. 5, the full dimension 34 of gap 18 may be defined by the height of the sealing medium, frit 20. Various layers of metal 22, 30 and layer 60 on diaphragm 14, FIG. 6, may be used to modify the mechanical (stiffness) and electrical (conductivity) responses of capacitive sensor 10d. Although thus far the substrate 12 has been indicated as a ceramic, this is not a limitation of the invention, for as shown in FIG. 7, substrate 12 in sensor 10e may be silicon, just as fixed plate silicon die 16. In that case, metal plate 22 would be optional since now the silicon in substrate 12 as well as that in die 16 can act as a conductor plate of the capacitor. In that case, FIG. 7, metal plate conductor 22 is optional.

Figure 8:
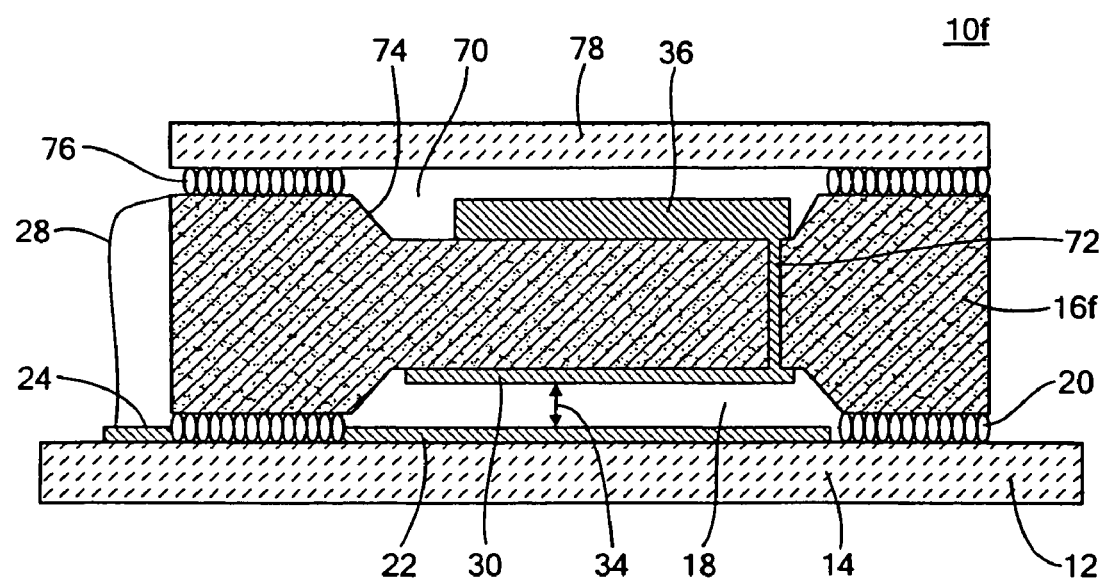
FIG. 8 is a side sectional diagrammatic view of a sealed capacitive sensor according to this invention with a second recess for housing associated circuitry or a second sensor e.g. an accelerometer.
Figure 9:
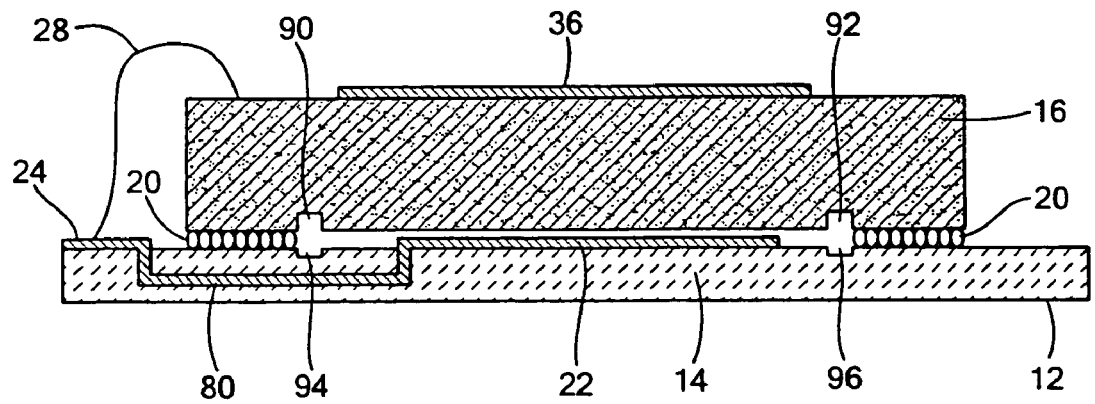
FIG. 9 is a view similar to FIG. 1 showing both upper and lower moats or wells and buried conductor traversing the sealing medium.
Figure 10:
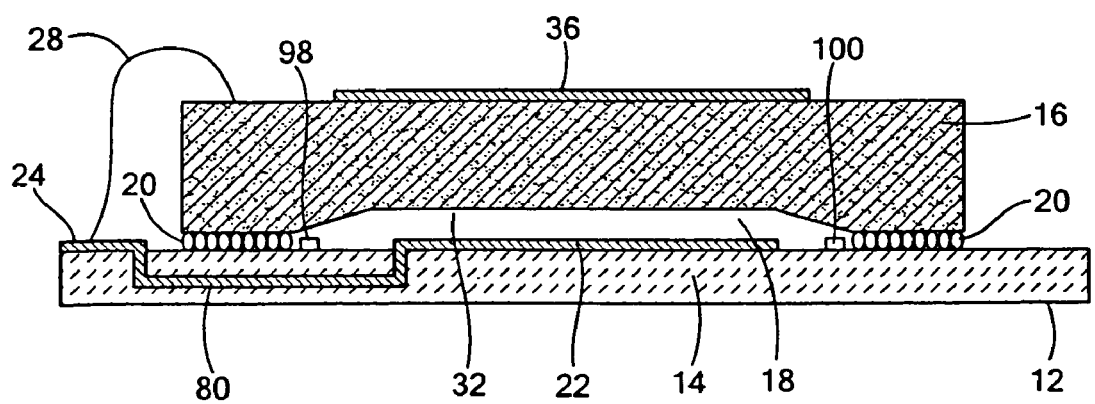
FIG. 10 is a view similar to FIG. 9 showing barrier walls in place of wells or moats.
Figure 11:
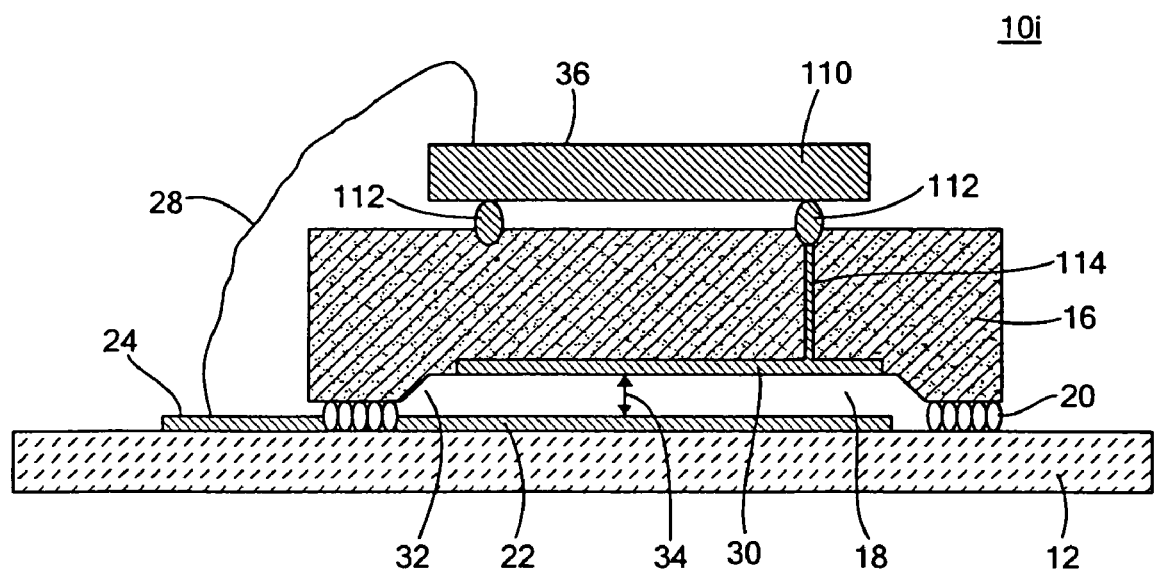
FIG. 11 is a view similar to FIG. 1 showing the active circuit borne by the fixed plate as a separate chip.

Capacitive sensor 10f may be formed as a dual recess device, FIG. 8, having a second recess 70 in which is disposed active circuit 36 and or other sensors, for example, accelerometer or capacitive sensors. Active circuit 36 may be connected to metal plate conductor 30 by means of via 72. Trace 74 passing under frit 76 to bond wire 28 and eventually to trace lead 24. Frit 76 acts to fix cover 78, made of for example ceramic or Kovar, to fixed plate silicon die 16f and hermetically seal second recess 70. Sealing medium 76 may be a frit, such as, a glass frit as used for sealing medium 20. The connection between metal plate conductor 22 and trace conductor 24 may use a buried conductor 80, FIG. 9, which traverses and passes beneath sealing medium 20 to improve the hermetic seal since the frit seals better to the ceramic 12 than to the metal 22, 24. Also shown in FIG. 9 are the use of wells or moats 90, 92 in fixed plate silicon die 16 and/or wells and moats 94, 96 in ceramic 12 to prevent spread of the frit during sealing. The material may be removed in either case in any suitable manner to create individual wells or a continuous moat to prevent the glass frit from moving, wicking, or spreading into the sensing area where it would interfere with the accuracy of the sensor. Alternatively, instead of moats or wells, barrier walls 98, FIG. 10, may be used for the same purpose. The walls, moats and wells are disclosed in more detail in co-pending application, U.S. patent application Ser. No. 11/353,358, entitled, IMPROVED CAPACITIVE SENSOR AND METHOD OF FABRICATING, by Meehan et al. (AD-444J), filed on even date herewith, which is herein incorporated in its entirety by this reference. If the active circuit 36, FIG. 11, is quite expensive as formed on silicon die 16, it may be more inexpensively produced on its own chip 110, FIG. 11, and then, for example, flip chip bonded using solder bumps 112 directly to silicon die 16. That contact may be sufficient or a via 114, for example, may be used to interconnect active circuit 36 with fixed plate conductor 30. Throughout here specific techniques of connections, such as, bond wires and vias, metal layers and traces, have been shown but these are not limitations of the invention, as any of the connection devices shown as well as other devices, not shown, may be used to interconnect the various components. The unit may also be incorporated into a ceramic package.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A sealed capacitive sensor comprising:
   a substrate having a diaphragm forming a first plate of a capacitor supported via supports;
   a second fixed plate of the capacitor spaced from the diaphragm and defining a dielectric gap and bearing an active electronic circuit associated with the capacitive sensor; and
   a frit sealing medium directly connecting together the substrate and fixed plate in a structure and hermetically sealing the gap, wherein the substrate further comprises a conductor buried in the substrate, such that the buried conductor traverses the sealing medium.

2. The sealed capacitive sensor of claim 1 in which the substrate includes ceramic.

3. The sealed capacitive sensor of claim 1 in which the substrate includes silicon.

4. The sealed capacitive sensor of claim 1 in which the fixed plate includes silicon.

5. The sealed capacitive sensor of claim 1 in which the frit includes a glass frit.

6. The sealed capacitive sensor of claim 1 in which at least one of the first and fixed plates includes a metal layer.

7. The sealed capacitive sensor of claim 1 in which the first and fixed plates comprise silicon.

8. The sealed capacitive sensor of claim 7 in which the silicon plates are doped.

9. The sealed capacitive sensor of claim 1 in which the fixed plate bears on a separate chip, an active electronic circuit associated with the capacitive sensor.

10. The sealed capacitive sensor of claim 9 in which there is an insulation layer between the active electronic circuit and the fixed plate.

11. The sealed capacitive sensor of claim 1 in which the fixed plate is electrically accessed through a wire bonding lead.

12. A sealed capacitive sensor comprising:
    a substrate having a diaphragm forming a first plate of a capacitor supported via supports;
    a fixed plate of the capacitor spaced from said diaphragm and defining a dielectric gap, the fixed plate comprising a recess on a first surface which is opposite the diaphragm and which defines at least a part of the gap dimension, and further comprising a second recess on a second surface of the fixed plate opposite the first surface, the second recess housing an active electric circuit associated with said capacitive sensor;
    a frit sealing medium directly connecting together said substrate and fixed plate in a structure and hermetically sealing said gap; and
    a cover covering the second surface of the fixed plate, and second sealing medium for connecting the cover to the fixed plate and hermetically sealing the second recess.

13. The sealed capacitive sensor of claim 12 in which the second sealing medium includes a frit.

14. The sealed capacitive sensor of claim 12 in which the second sealing medium includes a glass frit.

15. A sealed capacitive sensor comprising:
    a substrate having a diaphragm forming a first plate of a capacitor supported via supports;
    a fixed plate having a first surface and a second surface opposite the first surface, the first surface spaced from the diaphragm and defining a dielectric gap of the capacitor such that the diaphragm and the first surface form a variable capacitor, the fixed plate bearing an active electronic circuit associated with the capacitive sensor;
    an over mold covering the second surface of the fixed plate and attached to the substrate above the supports; and
    a frit sealing medium directly connecting together the substrate and the first surface of the fixed plate in a structure and hermetically sealing the gap.

16. The sealed capacitive sensor of claim 15, wherein the over mold covering comprises a glob top that provides a second seal for the gap.

17. The sealed capacitive sensor of claim 16 in which the substrate includes ceramic.

18. The sealed capacitive sensor of claim 16 in which the substrate includes silicon.

19. The sealed capacitive sensor of claim 15, wherein the over mold covering comprises plastic.

20. The sealed capacitive sensor of claim 19 in which the substrate includes ceramic.

* * * * *